(12) United States Patent
Yang et al.

(10) Patent No.: US 11,119,854 B2
(45) Date of Patent: Sep. 14, 2021

(54) METHOD OF CONTROLLING VERIFICATION OPERATIONS FOR ERROR CORRECTION OF NON-VOLATILE MEMORY DEVICE, AND NON-VOLATILE MEMORY DEVICE

(71) Applicant: ELITE SEMICONDUCTOR MEMORY TECHNOLOGY INC., Hsinchu (TW)

(72) Inventors: Yu-Kuo Yang, Hsinchu (TW); Takao Akaogi, Hsinchu (TW); Pauling Chen, Hsinchu (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 16/791,529

(22) Filed: Feb. 14, 2020

(65) Prior Publication Data
US 2021/0255921 A1    Aug. 19, 2021

(51) Int. Cl.
*G06F 11/10*  (2006.01)
*G06F 3/06*  (2006.01)

(52) U.S. Cl.
CPC ........ *G06F 11/1068* (2013.01); *G06F 3/0616* (2013.01); *G06F 3/0632* (2013.01); *G06F 3/0679* (2013.01)

(58) Field of Classification Search
CPC .................................................. G06F 11/1068
USPC ................... 714/764, 762, 765, 767
See application file for complete search history.

(56) References Cited

U.S. PATENT DOCUMENTS

| | | | |
|---|---|---|---|
| 6,321,361 B1 * | 11/2001 | Autechaud | G06F 11/10 714/799 |
| 8,051,339 B2 | 11/2011 | Sung et al. | |
| 8,261,174 B2 | 9/2012 | Lastras-Montano | |
| 9,037,929 B2 * | 5/2015 | Lee | G11C 16/10 714/719 |
| 10,243,671 B1 * | 3/2019 | Aouini | H04B 10/6164 |
| 2011/0246707 A1 * | 10/2011 | Ito | G06F 12/0246 711/103 |
| 2018/0246783 A1 * | 8/2018 | Avraham | H03M 13/1108 |

OTHER PUBLICATIONS

Error correction and error detection techniques for wireless ATM systems Aikawa Satoru; Motoyama Yasushi; Umehira Masahiro. Wireless Networks 3.4: 1-6. New York: Springer Nature B.V. (Sep. 1997) (Year: 1997).*

* cited by examiner

*Primary Examiner* — Fritz Alphonse
(74) *Attorney, Agent, or Firm* — Schmeiser, Olsen & Watts, LLP

(57) ABSTRACT

A method of controlling verification operations for error correction of a non-volatile memory device includes the following. A tolerated error bit (TEB) number for error correction of the non-volatile memory device is set to a first value to control verification operations in accordance with the TEB number. After at least one portion of the non-volatile memory device is programmed for a specific number of times, the TEB number is changed from the first value to a second value to control the verification operations in accordance with the TEB number, wherein the second value is greater than the first value and is less than or equal to the TEB threshold. The method may be performed while the at least one portion of the non-volatile memory device is programmed and verified.

11 Claims, 7 Drawing Sheets

METHOD OF CONTROLLING VERIFICATION OPERATIONS FOR ERROR CORRECTION OF NON-VOLATILE MEMORY DEVICE, AND NON-VOLATILE MEMORY DEVICE

BACKGROUND OF THE INVENTION

1. Field of the Invention

The present disclosure relates to a non-volatile memory device, and in particular to a method of controlling verification operations for error correction of a non-volatile memory device, and a non-volatile memory device using the same.

2. Description of the Related Art

Generally, the non-volatile memories, such as the flash memories, utilize the error correction code (ECC) to repair the soft error or the physical fault (hereinafter, the soft error and the physical fault are called fault) of the memory cell. However, using the error correction code to repair the data is limited; for example, the single-error-correcting and double error-detecting (SEC-DED) algorithm can only repair the single faulty bits. If more than one bit must be repaired, it must apply other algorithms and further storing spaces must be applied for the algorithms, thereby reducing the available memory space.

Conventionally, when a portion (e.g., a specific page) of a non-volatile memory is programmed, a verification operation is performed on the program bits (e.g., the bits of the page) of the non-volatile memory in which whether a determination is made as to whether the program bits include fail bits at the number above a reference value that indicates error correction capability of the non-volatile memory. If the number of fail bits is below the reference value, it is determined that the program bits are passed. If the number of fail bits exceeds the reference value, it is determined that the program bits are failed and the page will be programmed again and so on.

BRIEF SUMMARY OF THE INVENTION

An objective of the present disclosure is to provide technology for controlling verification operations for error correction of a non-volatile memory device.

To achieve the above objective, the present disclosure provides a method of controlling verification operations for error correction of a non-volatile memory device, the method comprises the following. Setting a tolerated error bit (TEB) number for error correction of the non-volatile memory device to a first value is performed to control verification operations in accordance with the TEB number, wherein the first value is less than a TEB threshold for error correction of the non-volatile memory device. After at least one portion of the non-volatile memory device is programmed for a specific number of times, changing the TEB number from the first value to a second value is performed to control the verification operations in accordance with the TEB number, wherein the second value is greater than the first value and is less than or equal to the TEB threshold.

In an embodiment, the TEB number is set to the first value when a pulse count is less than a pulse count threshold.

In an embodiment, the first value is zero or less than the TEB threshold.

In an embodiment, the TEB number is changed from the first value to the second value when the pulse count is equal to or greater than the pulse count threshold.

In some embodiments, the method further comprises increasing the TEB number incrementally from the second value at least one time to control the verification operations in accordance with the TEB number, wherein the increased TEB number is less than or equal to the TEB threshold.

In some embodiments, the method is performed while a process of programming and verification operations is performed on the at least one portion of the non-volatile memory device.

To achieve the above objective, the present disclosure further provides a non-volatile memory device including a non-volatile memory cell array, a page buffer circuit, and a control logic circuit. The page buffer circuit is coupled to the non-volatile memory cell array. The control logic circuit is coupled to the non-volatile memory cell array and the page buffer circuit. The control logic circuit is utilized for controlling the non-volatile memory device. While the control logic circuit controls at least one portion of the non-volatile memory cell array to be programmed and verified, the control logic circuit sets a tolerated error bit (TEB) number to a first value to control verification operations in accordance with the TEB number, wherein the first value is less than a TEB threshold for error correction of the non-volatile memory device; and after the at least one portion of the non-volatile memory cell array is programmed for a specific number of times, the control logic circuit changes the TEB number from the first value to a second value to control the verification operations in accordance with the TEB number, wherein the second value is greater than the first value and is less than or equal to the TEB threshold.

In an embodiment, the control logic circuit increases the TEB number incrementally from the second value at least one time to control the verification operations in accordance with the TEB number, wherein the increased TEB number is less than or equal to the TEB threshold.

As such, the embodiments of a method of controlling verification operations for error correction of a non-volatile memory device, and a non-volatile memory device using the method are provided. In this way, the method can enhance the probability of data to be programmed properly. Hence, the method can prevent ECC capability of the non-volatile memory device from being consumed due to data to be written being less than or equal to the TEB number, thus enhancing reliability of the non-volatile memory device.

DETAILED DESCRIPTION OF THE INVENTION

To facilitate understanding of the object, characteristics and effects of this present disclosure, embodiments together with the attached drawings for the detailed description of the present disclosure are provided.

In the following, embodiments of implementing the technology of controlling verification operations for error correction of a non-volatile memory are provided, in which a tolerated error bit (TEB) number for error correction of the non-volatile memory device may change during verification operations related to programming operations. In some embodiments, the TEB number may be assigned in some manners such that the non-volatile memory device becomes more reliable and prevents specific program data from consuming error correction capability.

For the sake of explaining the practical application of the technology as will be exemplified below, it is supposed that in a specific scenario, a computing device, such as a smart phone, a tablet computer, or server, and so on, is required to write data of a small number of bits into a non-volatile memory device, such as a flash memory device, wherein the non-volatile memory device is required to have a capability of X-bit error correction code (ECC) per Y bytes, for example, 8-bit ECC per 512 bytes. When a portion (e.g., a specific page) of the non-volatile memory device is programmed, a verification operation is performed on the program bits (e.g., the bits of the page) of the non-volatile memory device in which a determination is made as to whether the program bits include fail bits at the number above the TEB number. If the number of fail bits is below or equal to the TEB number, it is determined that the program bits are passed. If the number of fail bits exceeds the TEB number, it is determined that the program bits are failed and the page will be programmed again and so on. In general, the TEB number is a fixed value indicating error correction capability of the non-volatile memory. In this scenario, a page is 512 bytes and the TEB number is 8, for instance.

A specific situation was observed by the inventor for the above scenario. In this situation, the data from the computing device, whose bit number is less than or equal to the TEB number, is to be written into a blank area, where all bits are previously the same value, of the non-volatile memory. Whenever a verification operation is performed, the verification operation will always be passed because the data to be written is actually less than or equal to the TEB number. In such a situation, no programming operation will then be executed, even though the data may not be properly programmed. As a result, the data that is assumed to be programmed would consume the ECC capability. In the worst case, if the data is corrupted because of not properly programmed, the computing device might experience crashing or hanging up. The situation of the above scenario is critical to the non-volatile memory.

Figure 1:
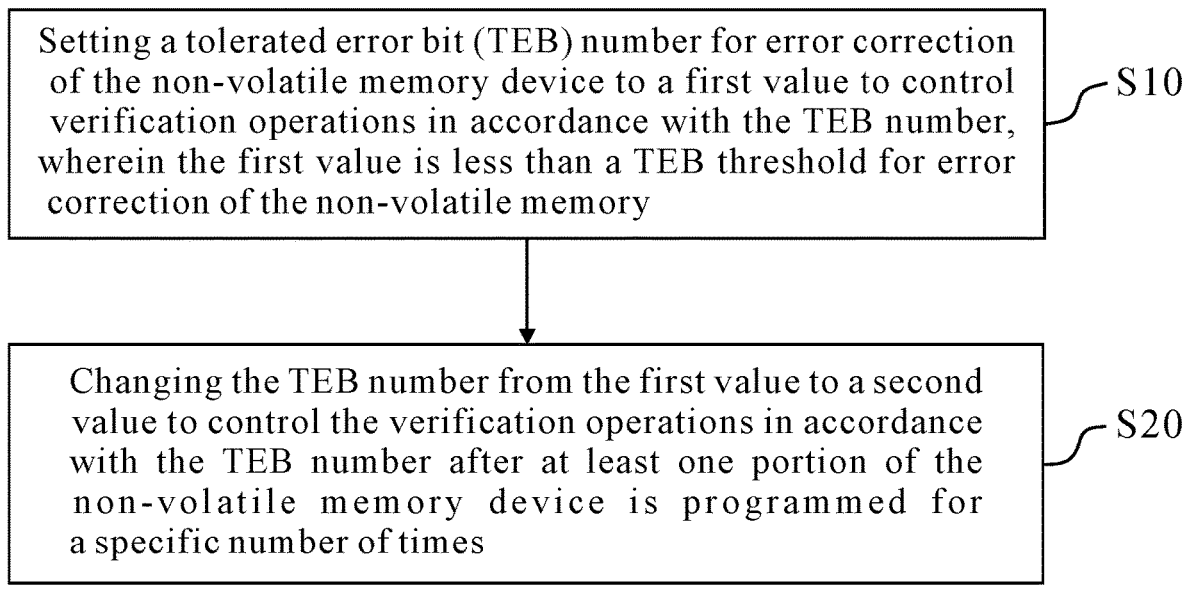
FIG. 1 is a flowchart illustrating a method of controlling verification operations for error correction of a non-volatile memory according to embodiments of the present disclosure.

Referring to FIG. 1, a method of controlling verification operations for error correction of a non-volatile memory device is illustrated according to embodiments of the present disclosure in a flowchart form. The method includes steps S10 and S20.

As indicated in step S10, a tolerated error bit (TEB) number for error correction of the non-volatile memory device to a first value is performed to control verification operations in accordance with the TEB number, wherein the first value is less than a TEB threshold for error correction of the non-volatile memory.

As indicated in step S20, after at least one portion of the non-volatile memory device is programmed for a specific number of times, changing the TEB number from the first value to a second value is performed to control the verification operations in accordance with the TEB number, wherein the second value is greater than the first value and is less than or equal to the TEB threshold.

As such, the method can prevent the ECC capability from being consumed due to data to be written being less than or equal to the TEB number. For the sake of illustration, by way of the step S10, setting the TEB number to a first value (e.g., 0, 1, or 2) less than TEB threshold (e.g., 8), when a verification operation is undergone, as in the above discussed scenario for example, the verification operation will be failed because the data to be written (e.g., a small number of bits such as 8, 7 bits or less) is actually greater than the TEB number (e.g., 0, 1, or 2). In a situation where a technique known as incremental step pulse programming (ISPP) is applied to the non-volatile memory, a programming operation will then be executed since the verification operation is failed with respect to the TEB number of the first value, regardless of whether the data is properly programmed or not. In the incremental step pulse programming, the verification operation may result in a failure result repeatedly while the at least one portion of the non-volatile memory (e.g., the data of small number of bits such as 8, 7 bits or less is written) is programmed for a specific number of times (e.g., 3 or 4). By way of the step S20, the TEB number is changed from the first value (e.g., 0) to a second value (e.g., 5, 6, 7, or 8) greater than the first value to control the verification operations in accordance with the TEB number after the at least one portion of the non-volatile memory device is programmed for the specific number of times (e.g., 3 or 4), wherein the second value is less than or equal to the TEB threshold. In this way, the data to be written will be programmed for a specific number of times even though the data to be written may be of bit number less than the TEB threshold, thus enhancing the probability of the data to be programmed properly. Hence, the method can prevent the ECC capability of the non-volatile memory device from being consumed due to data to be written being less than or equal to the TEB number, thus enhancing reliability of the non-volatile memory device. By contrast, in the conventional approach, the TEB number is fixedly set to the TEB threshold; i.e., the maximum ECC capability is released, such that the programming operation will not be executed when the data to be written is of bit number less than the TEB threshold.

Figure 2:
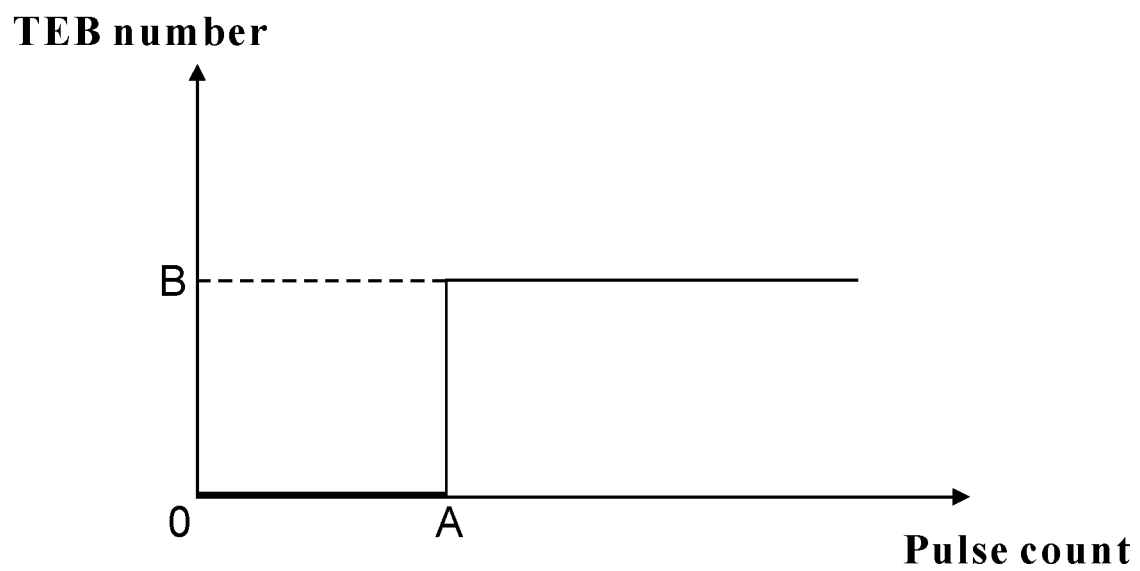
FIG. 2 is a schematic diagram illustrating an example of implementation of the method of FIG. 1.

In an embodiment, the TEB number is set to the first value when a pulse count is less than a pulse count threshold. For example, it is known that in the incremental step pulse programming, each time a programming operation is performed, a pulse count is incremented. Referring to FIG. 2, when the pulse count is less than a pulse count threshold, as indicated by A (e.g., 3 or 4) in FIG. 2, the TEB number is set to the first value, which may be zero or less than the TEB threshold.

Referring to FIG. 2, in an embodiment, the TEB number is changed from the first value (e.g., 0) to the second value, as indicated by B (e.g., 3 or 4) in FIG. 2, when the pulse count is equal to or greater than the pulse count threshold.

Figure 3:
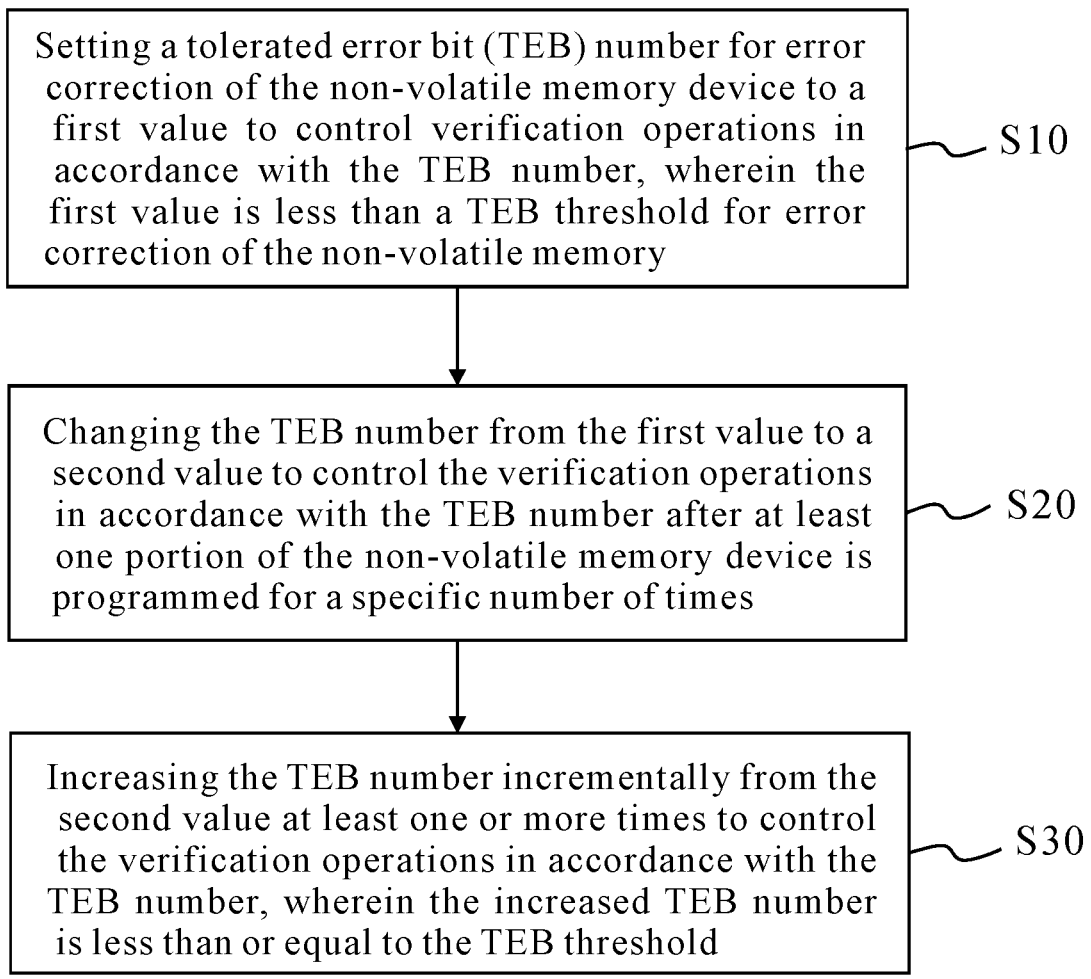
FIG. 3 is a flowchart illustrating a method of controlling verification operations for error correction of a non-volatile memory according to some embodiments of the present disclosure.

Referring to FIG. 3, a method of controlling verification operations for error correction of a non-volatile memory device is illustrating according to some embodiments based on FIG. 1.

As shown in FIG. 3, the method includes the step S10, S20 as the same of those of FIG. 1 with the second value less than the TEB threshold, and further includes step S30. As indicated in step S30, the TEB number is increased incrementally from the second value at least one or more times to control the verification operations in accordance with the TEB number, wherein the increased TEB number is less than or equal to the TEB threshold.

In some embodiments of step S30, the TEB number may be increased for a plurality of times with a same increment (e.g., 1, 2, or 3) or with respective increments.

Figure 4:
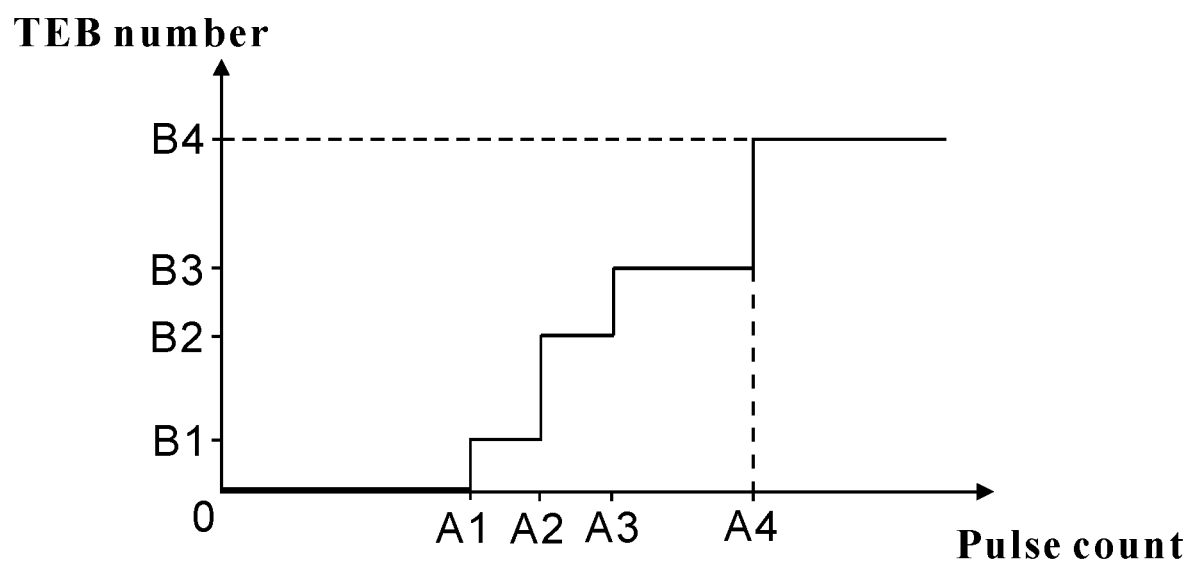
FIG. 4 is a schematic diagram illustrating an example of implementation of the method of FIG. 3.

In an embodiment of the method of FIG. 3, for example, in an incremental step pulse programming of a portion of the non-volatile memory, when the pulse count is less than a pulse count value A1, as indicated by A1 (e.g., 4) in FIG. 4, the TEB number is set to the first value (e.g., 0) by way of step S10 of FIG. 3, wherein the first value may be zero or less than the TEB threshold. When the pulse count is equal to the pulse count value A1 (e.g., 4), the TEB number is changed from the first value (e.g., 0) to the second value, e.g., a TEM number B1 (e.g., 1) as indicated in FIG. 4, by way of step S20 of FIG. 3. Afterwards, the TEB number is increased incrementally from the second value at least one or more times through step S30 of FIG. 3. Referring to FIG. 4, the TEB number changes from the second value (e.g., the TEM number B1) to a TEM number B2 (e.g., 3) when the pulse count is equal to a pulse count value A2 (e.g., 5). The TEB number changes from the TEM number B2 (e.g., 3) to a TEM number B3 (e.g., 4) when the pulse count is equal to a pulse count value A3 (e.g., 6). The TEB number finally changes from the TEM number B3 (e.g., 4) to a TEM number B4 (e.g., 6) when the pulse count is equal to a pulse count value A4 (e.g., 8). In this manner, for an example of an incremental step pulse programming of a portion of the non-volatile memory, the ECC capability can be reserved until the pulse count satisfies a criterion, such as being equal to a pulse count value A1, and the data to be written will be programmed for a specific number of times even though the data to be written may be of bit number less than the TEB threshold, thus enhancing the probability of the data to be programmed properly. In addition, the ECC capability can be released incrementally after the criterion is satisfied. Hence, the method can prevent the ECC capability of the non-volatile memory device from being consumed due to data to be written being less than or equal to the TEB number, thus enhancing reliability of the non-volatile memory device.

The following further provides embodiments for implementation of the method as illustrated in the examples based on FIG. 1, 2, 3, or 4 above.

In an embodiment, a non-volatile memory device is provided, including a non-volatile memory cell array, a page buffer circuit, and a control logic circuit. The non-volatile memory device may be a flash memory device, for example.

The page buffer circuit is coupled to the non-volatile memory cell array. The control logic circuit is coupled to the non-volatile memory cell array and the page buffer circuit. The control logic circuit is utilized for controlling the non-volatile memory device.

For example, the control logic circuit can be configured to implement the method as illustrated in the examples based on FIG. 1, 2, 3, or 4 above. While the control logic circuit controls at least one portion of the non-volatile memory cell array to be programmed and verified, the control logic circuit sets a tolerated error bit (TEB) number to a first value to control verification operations in accordance with the TEB number, wherein the first value is less than a TEB threshold for error correction of the non-volatile memory device; and after the at least one portion of the non-volatile memory cell array is programmed for a specific number of times, the control logic circuit changes the TEB number from the first value to a second value to control the verification operations in accordance with the TEB number, wherein the second value is greater than the first value and is less than or equal to the TEB threshold.

In an embodiment, the control logic circuit sets the TEB number to the first value when a pulse count is less than a pulse count threshold.

In an embodiment, the control logic circuit sets the first value to zero or a value less than the TEB threshold.

In an embodiment, the control logic circuit changes the TEB number from the first value to the second value when the pulse count is equal to or greater than the pulse count threshold.

In an embodiment, the control logic circuit increases the TEB number incrementally from the second value at least one time to control the verification operations in accordance with the TEB number, wherein the increased TEB number is less than or equal to the TEB threshold.

Figure 5:
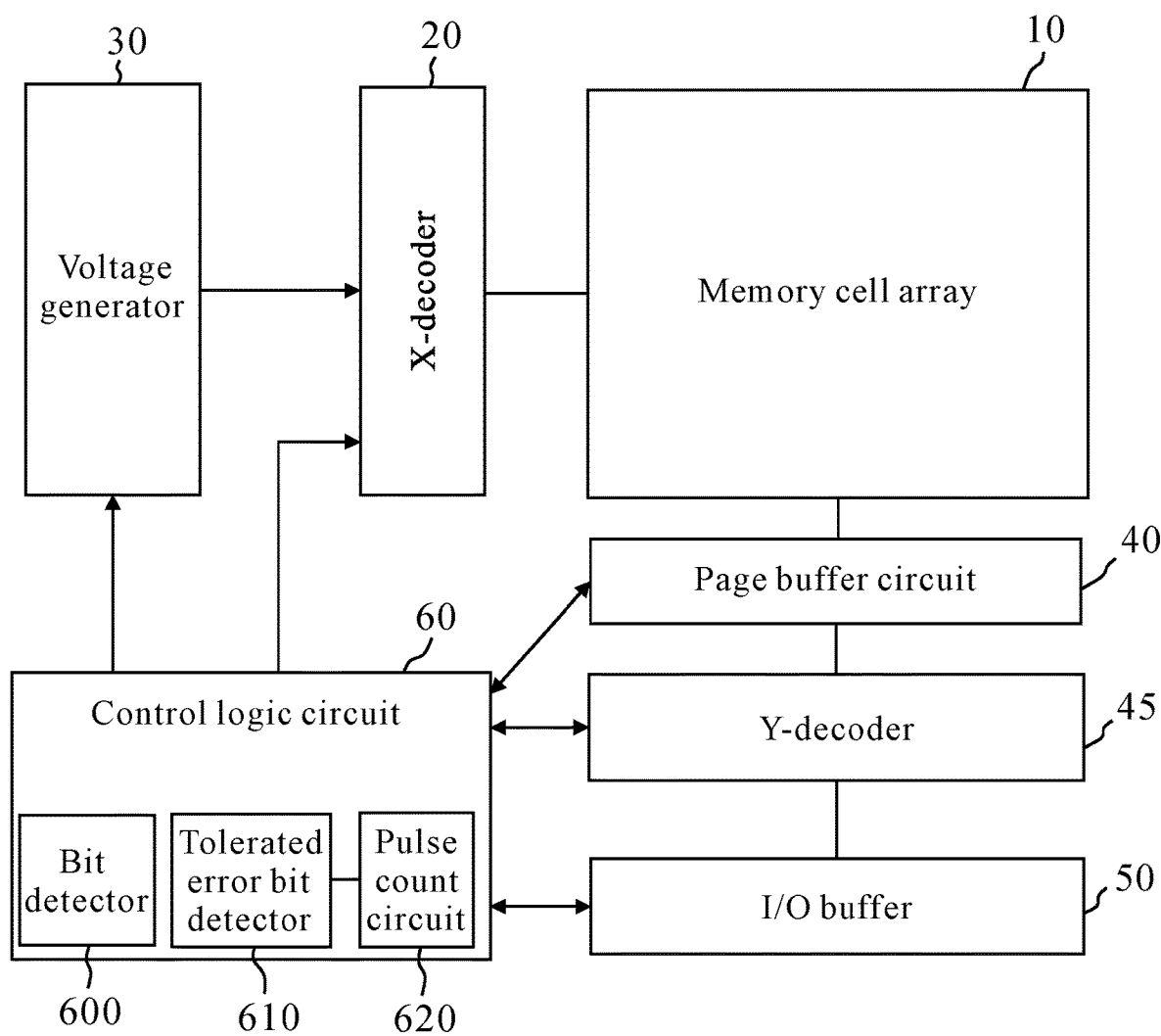
FIG. 5 is a block diagram illustrating a non-volatile memory device according to an embodiment of the present disclosure.

Referring to FIG. 5, a non-volatile memory device based on the above embodiment is illustrated in a block diagram form. As shown in FIG. 5, a non-volatile memory device 1 includes a memory cell array 10, an X-decoder 20, a voltage generator 30, a page buffer circuit 40, a Y-decoder 45, an input/output (I/O) buffer 50, and a control logic circuit 60. For the sake of illustration, the non-volatile memory device 1, for example, is a flash memory device, such as a NAND flash memory device. Certainly, the implementation of the invention is not limited to the examples.

The memory cell array 10 includes memory cells arranged in rows connected to word lines and columns connected to bit lines. Each memory cell stores 1-bit data or M-bit data, where M is an integer greater than one. Each memory cell is capable of storing data using a charge storage layer such as a floating gate or a charge trapping layer, a variable resistor, or another type of memory element.

The X-decoder 20 is employed to perform selection and driving operations for the rows of memory cell array 10.

The voltage generator 30 is controlled by the control logic circuit 60 and generates voltages (for example, a program voltage, a pass voltage, an erase voltage, and a read voltage) for program, erase, and read operations.

The page buffer circuit 40 and Y-decoder 45 are controlled by the control logic circuit 60 and operates as a sense amplifier or a write driver according to various operation modes of the flash memory device. For example, in a read operation, the page buffer circuit 40 and Y-decoder 45 operates as a sense amplifier for sensing data from selected memory cells of a selected row. For example, in a programming operation, the page buffer circuit 40 and Y-decoder 45 operates as a write driver to drive selected memory cells of a selected row according to program data. The page buffer circuit 40 includes a plurality of page buffers corresponding to respective bit lines or bit-line pairs.

The input/output (I/O) buffer 50 receives read data from the page buffer circuit 40 and Y-decoder 45 and transmits the read data to an external destination, such as a computing device. Input/output circuit 600 typically interfaces with an external device, such as a memory controller or a host.

The control logic circuit 60 is utilized for controlling the operations of the non-volatile memory device 1. The control logic circuit 60 may be implemented to include a bit detector 600, a tolerated error bit detector 610 and a pulse count circuit 620.

For example, the control logic circuit 60 may be configured, for example, by using a bit detector 600, to receive data that has been read by the page buffer circuit 40 and Y-decoder 45 in a verification operation. The control logic circuit 60 can determine whether the at least one selected memory cell is program passed, for example, by using the bit detector 600, by way of checking whether a threshold voltage of at least one of the selected memory cells is greater than or equal to an associated verification level, based on the data read by the page buffer circuit 40.

The tolerated error bit detector 610, in response to a TEB number, is capable of determining whether the data read by the page buffer circuit 40 includes fail bits at the number below or equal to the TEB number. The tolerated error bit detector 610 can be implemented by an analog circuit and/or digital circuit, such as a current sensing amplifier, counter, and logic circuit whenever appropriate.

The pulse count circuit 620 is employed to count the pulse count, for example, during the incremental step pulse programming. The pulse count circuit 620 can be implemented by a digital circuit, such as a counter and sequential and/or combinational logic circuit whenever appropriate. The pulse count may be program pulse count or erase pulse count.

The control logic circuit 60 may further include one or more registers to store pass or failure information during programming. For example, the control logic circuit 60 determines whether all the selected memory cells are successfully programmed based on the read data provided from the page buffer circuit 40 and Y-decoder 45 during the verification operation.

In some embodiments, the control logic circuit 60 can be configured to implement steps S10 and S20 of FIG. 1 or steps S10-S30 of FIG. 3, as illustrated in the examples based on FIG. 1, 2, 3, or 4 above. For example, the control logic circuit 60 may be configured to read the pulse count of the pulse count circuit 620 and determine when to set the TEB number to the first value, the second value, or another value incrementally for the tolerated error bit detector 610, based on the pulse count received from the pulse count circuit 620.

In another embodiment, the tolerated error bit detector 610 may be configured to be coupled to the pulse count circuit 620 to receive a TEB number and the pulse count circuit 620 is configured to include a logic circuit to store a pulse count and control the TEB detector at least based on the pulse count. The logic circuit of the pulse count circuit 620 may be configured to read the pulse count stored in the pulse count circuit 620 and determine when to set the TEB number for the tolerated error bit detector 610 to the first number, the second number, or another number incrementally for the tolerated error bit detector 610, based on the pulse count stored in the pulse count circuit 620. Certainly, the implementation of the invention is not limited to the examples.

Figure 6:
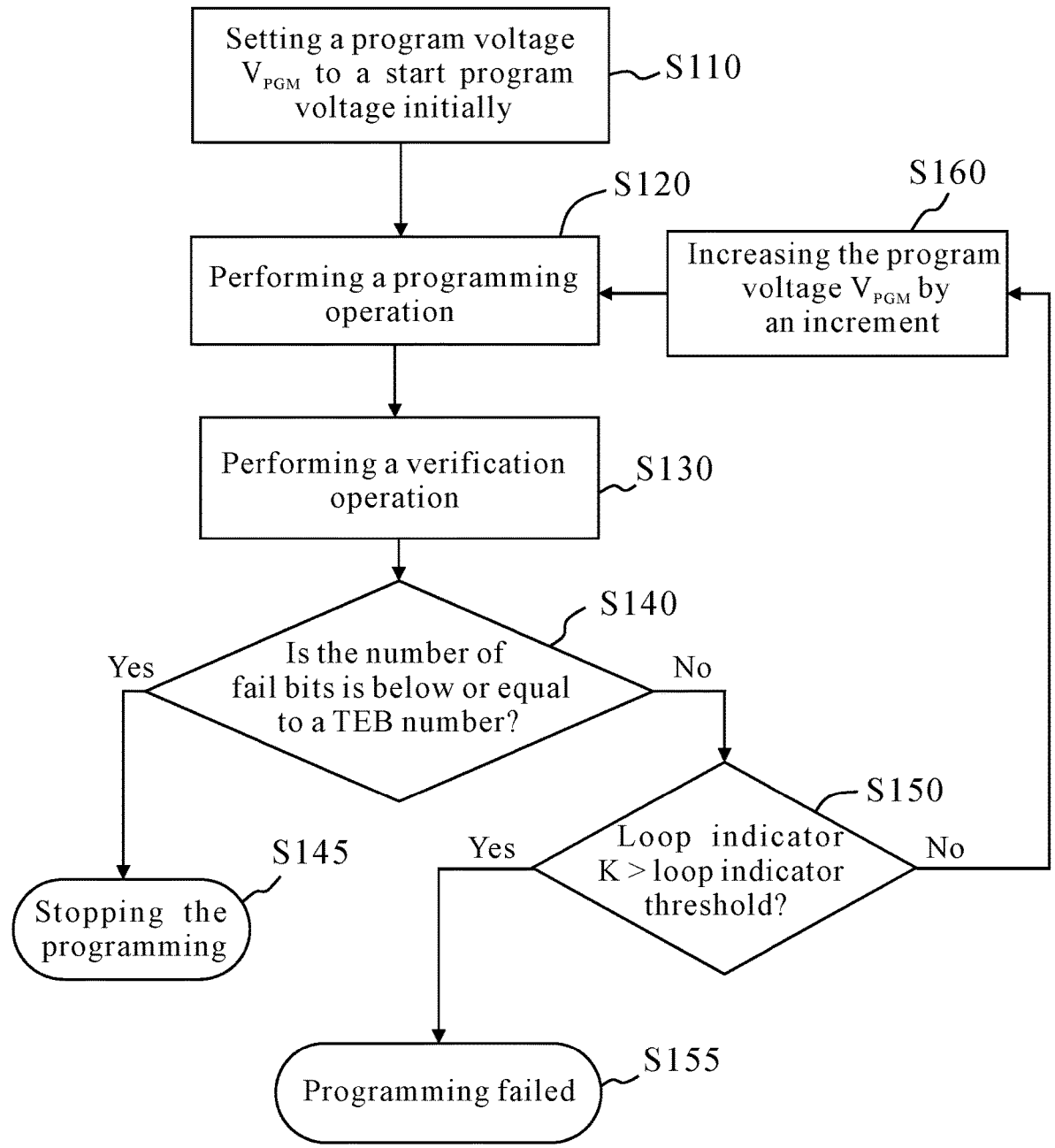
FIG. 6 is a flowchart illustrating a process of programming and verification for the non-volatile memory while the method according to an embodiment of the present disclosure is performed.

In some embodiments, the method of FIG. 1 or FIG. 3 may be performed while a process of programming and verification operations is performed on the at least one portion of the non-volatile memory. Referring to FIG. 6, the process of programming and verification is illustrated, such as an example of incremental step pulse programming. The process of FIG. 6 includes steps S110 to S160.

In step S110, a program voltage VPGM is set to a start program voltage initially, wherein a loop indicator K is set to 1 and a pass flag is set to 0.

In step S120, a programming operation, indicated by PP, is performed for a portion of the non-volatile memory, such as a page.

In step S130, a verification operation, indicated by PV, is performed. In step S140, it is determined whether the number of fail bits is below or equal to the TEB number. If so, it indicates that the verification operation is passed, wherein the pass flag is set to 1; and the programming is stopped, as indicated in step S145. If not, the process proceeds to step S150 to check whether the loop indicator K is greater than a loop indicator threshold.

In step S150, if the determination is positive, it indicates that the programming is failed, as indicated in step S155. If the determination is failed in step S150, the process proceeds to step S160 in which the program voltage VPGM is increased by an increment and the loop indicator K is incremented as well and then proceeds to step S120 to perform a next loop of the process.

In an embodiment, the TEB number for the step S140 can be set by way of the method as illustrated in the examples based on FIG. 1, 2, 3, or 4 above.

Figure 7:
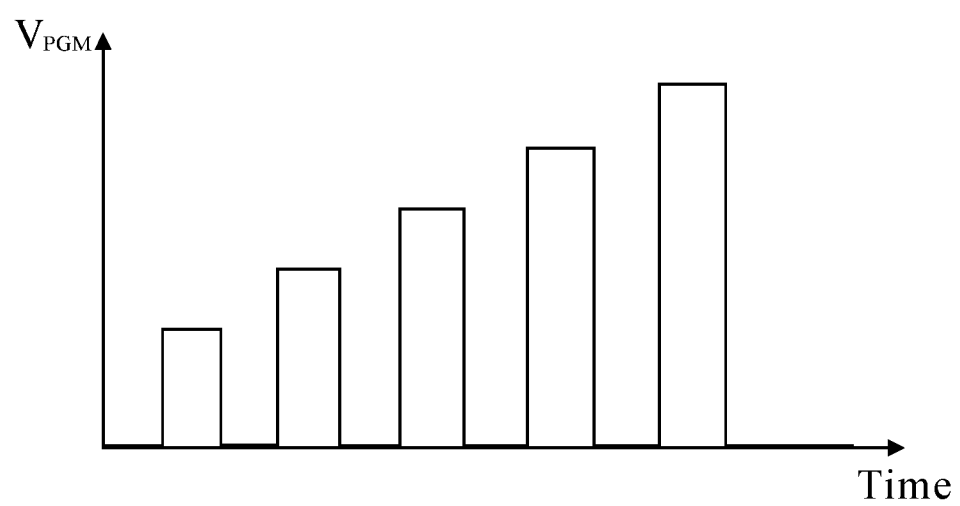
FIG. 7 is a schematic diagram illustrating an example of the program voltage increasing during the performance of the method of FIG. 6.

Referring to FIGS. 6 and 7, the program voltage VPGM will be increased incrementally through a plurality of looping of the process. In some embodiments, the method based on FIG. 1 or 3 may be performed while the process of programming and verification operations as shown in FIG. 6 is performed.

The following TABLE 1 and 2 are two examples that the method based on FIGS. 1 and 3, respectively while the process, such as an example of incremental step pulse programming, is performed where the program voltage, i.e., ISPP voltage, is increasing incrementally.

TABLE 1 illustrates that the TEB number is set to zero initially and is then set to 7, a maximum TEB number in this example, when the pulse count is equal to 4.

TABLE 1

| ISPP Voltage (V) | Pulse count | TEB number |
|---|---|---|
| 11.8 | 0 | 0 |
| 12.4 | 1 | 0 |
| 12.8 | 2 | 0 |
| 13.4 | 3 | 0 |
| 13.8 | 4 | 7 |
| 14.4 | 5 | 7 |
| 14.8 | 6 | 7 |
| 15.4 | 7 | 7 |
| 15.8 | 8 | 7 |
| 16.4 | 9 | 7 |
| 16.8 | 10 | 7 |
| 17.4 | 11 | 7 |
| 17.8 | 12 | 7 |
| 18.4 | 13 | 7 |
| 18.8 | 14 | 7 |
| 19.4 | 15 | 7 |

TABLE 2 illustrates that the TEB number is set to zero initially and is then increased incrementally; and the TEB number is set to 7 when the pulse count is equal to 4.

TABLE 2

| ISPP Voltage (V) | Pulse count | TEB number |
|---|---|---|
| 11.8 | 0 | 0 |
| 12.4 | 1 | 1 |

TABLE 2-continued

| ISPP Voltage (V) | Pulse count | TEB number |
|---|---|---|
| 12.8 | 2 | 3 |
| 13.4 | 3 | 5 |
| 13.8 | 4 | 7 |
| 14.4 | 5 | 7 |
| 14.8 | 6 | 7 |
| 15.4 | 7 | 7 |
| 15.8 | 8 | 7 |
| 16.4 | 9 | 7 |
| 16.8 | 10 | 7 |
| 17.4 | 11 | 7 |
| 17.8 | 12 | 7 |
| 18.4 | 13 | 7 |
| 18.8 | 14 | 7 |
| 19.4 | 15 | 7 |

In some embodiments, the TEB number can be set to the TEB threshold when the pulse count is equal to or exceeds a pulse count threshold. The pulse count threshold may be determined based on the performance or characteristics of the non-volatile memory device. For example, the pulse count threshold may be determined based on a disturb value (such as a program disturb, a Vpass disturb, and/or a Vpp disturb) and/or a program time requirement of the non-volatile memory device.

In some embodiments, the verification operation can be determined as passed when two or more consecutive passes are detected.

As such, the embodiments of a method of controlling verification operations for a non-volatile memory device, and a non-volatile memory device using the same are provided. In this way, the data to be written will be programmed for a specific number of times even though the data to be written may be of bit number less than the TEB threshold, thus enhancing the probability of the data to be programmed properly. Hence, the method can prevent the ECC capability of the non-volatile memory device from being consumed due to data to be written being less than or equal to the TEB number, thus enhancing reliability of the non-volatile memory device.

While the present disclosure has been described by way of specific embodiments, numerous modifications, combinations, and variations could be made thereto by those skilled in the art without departing from the scope and spirit of the present disclosure set forth in the claims.

What is claimed is:

1. A method of controlling verification operations for error correction of a non-volatile memory device, the method comprising:
setting a tolerated error bit (TEB) number for error correction of the non-volatile memory device to a first value to control verification operations in accordance with the TEB number, wherein the first value is less than a TEB threshold for error correction of the non-volatile memory; and
after at least one portion of the non-volatile memory device is programmed for a specific number of times, changing the TEB number from the first value to a second value to control the verification operations in accordance with the TEB number, wherein the second value is greater than the first value and is less than or equal to the TEB threshold.

2. The method according to claim 1, wherein the TEB number is set to the first value when a pulse count is less than a pulse count threshold.

3. The method according to claim 2, wherein the first value is zero or less than the TEB threshold.

4. The method according to claim 2, wherein the TEB number is changed from the first value to the second value when the pulse count is equal to or greater than the pulse count threshold.

5. The method according to claim 1, further comprising:
increasing the TEB number incrementally from the second value at least one time to control the verification operations in accordance with the TEB number, wherein the increased TEB number is less than or equal to the TEB threshold.

6. The method according to claim 1, wherein the method is performed while the at least one portion of the non-volatile memory device is programmed and verified.

7. A non-volatile memory device, comprising:
a non-volatile memory cell array;
a page buffer circuit, coupled to the non-volatile memory cell array; and
a control logic circuit, coupled to the non-volatile memory cell array and the page buffer circuit, for control the non-volatile memory device,
wherein while the control logic circuit controls at least one portion of the non-volatile memory cell array to be programmed and verified, the control logic circuit sets a tolerated error bit (TEB) number to a first value to control verification operations in accordance with the TEB number, wherein the first value is less than a TEB threshold for error correction of the non-volatile memory; and after the at least one portion of the non-volatile memory cell array is programmed for a specific number of times, the control logic circuit changes the TEB number from the first value to a second value to control the verification operations in accordance with the TEB number, wherein the second value is greater than the first value and is less than or equal to the TEB threshold.

8. The non-volatile memory device according to claim 7, wherein the control logic circuit sets the TEB number to the first value when a pulse count is less than a pulse count threshold.

9. The non-volatile memory device according to claim 8, wherein the control logic circuit sets the first value to zero or a value less than the TEB threshold.

10. The non-volatile memory device according to claim 8, wherein the control logic circuit changes the TEB number from the first value to the second value when the pulse count is equal to or greater than the pulse count threshold.

11. The non-volatile memory device according to claim 7, wherein the control logic circuit increases the TEB number incrementally from the second value at least one time to control the verification operations in accordance with the TEB number, wherein the increased TEB number is less than or equal to the TEB threshold.

* * * * *